United States Patent
Okumura et al.

(10) Patent No.: US 8,390,032 B2
(45) Date of Patent: Mar. 5, 2013

(54) DEPLETION MODE FIELD EFFECT TRANSISTOR FOR ESD PROTECTION

(75) Inventors: Yohichi Okumura, Nerima-Ku (JP); Josef Muenz, Munich (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/274,103

(22) Filed: Oct. 14, 2011

(65) Prior Publication Data

US 2012/0032270 A1  Feb. 9, 2012

Related U.S. Application Data

(63) Continuation of application No. 11/857,576, filed on Sep. 19, 2007, now abandoned.

(30) Foreign Application Priority Data

Sep. 22, 2006 (JP) ................. 2006-257274

(51) Int. Cl.
*H01L 27/118* (2006.01)
*H01L 29/66* (2006.01)
(52) U.S. Cl. ........ 257/205; 257/266; 257/341; 257/365; 257/202; 257/E29.134
(58) Field of Classification Search .......... 257/266, 257/287, 341 M, 401, E29.052, E29.056, 257/202, 205, 329, 365, 341, 342, E29.134
See application file for complete search history.

(56) References Cited

U.S. PATENT DOCUMENTS

| | | | |
|---|---|---|---|
| 3,354,362 A | 11/1967 | Zuleeg | |
| 3,783,349 A * | 1/1974 | Beasom | 257/287 |
| 3,977,017 A | 8/1976 | Ishitani | |
| 4,636,825 A * | 1/1987 | Baynes | 257/401 |
| 4,821,084 A | 4/1989 | Kinugasa et al. | |
| 5,187,552 A | 2/1993 | Hendrickson et al. | |
| 6,064,264 A | 5/2000 | Tarsia et al. | |
| 6,121,657 A * | 9/2000 | Yama | 257/341 |
| 6,269,199 B1 * | 7/2001 | Maloney | 385/14 |
| 6,278,264 B1 | 8/2001 | Burstein et al. | |
| 2004/0004231 A1 | 1/2004 | Peng et al. | |
| 2004/0188776 A1 | 9/2004 | Russ et al. | |
| 2006/0221489 A1 | 10/2006 | Christianson et al. | |
| 2006/0250736 A1 | 11/2006 | Harris | |

* cited by examiner

*Primary Examiner* — Colleen Matthews
*Assistant Examiner* — Galina Yushina
(74) *Attorney, Agent, or Firm* — Alan A. R. Cooper; Wade J. Brady, III; Frederick J. Telecky, Jr.

(57) ABSTRACT

A field effect transistor is provided having a reduced drain capacitance per unit gate width. A gate electrode 21 (G) having a plurality of sides is formed in first-conductivity first semiconductor region 14. Drain region 18D (D) is formed inside the gate electrode, and source regions 18S (S) are formed in respective regions outside the plurality of sides in widths that do not reduce the corresponding channel widths of the drain region. The gate electrode is formed along all the plurality of sides of the drain region in order to form a transistor.

15 Claims, 9 Drawing Sheets

DEPLETION MODE FIELD EFFECT TRANSISTOR FOR ESD PROTECTION

This application is a continuation of prior application Ser. No. 11/857,576, filed Sep. 19, 2007, which claims the benefit of the Japanese Application No. 2006-257274, filed Sep. 22, 2006, the entireties of both of which are hereby incorporated by reference.

BACKGROUND

The invention relates to a field effect transistor. In particular, it relates to a depletion type n-channel MOS field effect transistor that is used in a circuit to protect against electrostatic breakdown of a magnetic head.

For example, in the case of a magnetic head, such as a GMR magnetic head, incorporated into a magnetic recording device such as an HDD (hard disk drive), a depletion type n-channel MOS field effect transistor is utilized inside a preamplifier IC as a protective circuit to protect the magnetic head from an electrostatic breakdown.

FIG. 8A is a plan view of a depletion type n-channel MOS field effect transistor according to the prior art. As shown in FIG. 8A, gate electrode 41 is formed in a p-type semiconductor region defined on a semiconductor substrate via a gate insulation film, and n-type source region 40S and drain region 40D are formed at surface parts of the p-type semiconductor region at either side part of gate electrode 41. Furthermore, an n-type channel region is formed on the surface part of the p-type semiconductor region immediately below gate electrode 41 so as to form a depletion type n-channel MOS field effect transistor.

Due to increased speeds and capacities of HDDs, there is a demand for depletion type n-channel field effect transistors with lower on-resistances in order to improve the performance of ESD protection elements at low capacitances. To realize this, reductions in the on-resistance and the drain capacitance are required, and a technique for reducing the on-resistance while keeping the drain capacitance unchanged has been adopted.

FIG. 8B is a plan view of a depletion type n-channel MOS field effect transistor according to the prior art. Two gate electrodes 41a and 41b are formed in a p-type semiconductor region provided on a semiconductor substrate via a gate insulation film; and source region 40Sa, drain region 40D, and source region 40Sb are formed in three respective regions that are separated by the two gate electrodes 41a and 41b on the surface part of the p-type semiconductor region. N-channel regions are formed in the p-type semiconductor regions immediately below the two gate electrodes 41a and 41b so as to form a depletion type n-channel MOS field effect transistor.

As opposed to the field effect transistor with the configuration shown in FIG. 8A, in the case of the field effect transistor with the configuration shown in FIG. 8B, because the gate width is set approximately two times as wide while keeping the drain capacitance unchanged, the on-resistance is reduced to approximately one-half. That is, the drain capacitance per unit gate width is reduced by approximately one-half.

However, in recent years, there is a greater demand for faster driving, and further reduction in the on-resistance and the drain capacitance is needed. The invention was devised in light of the aforementioned situation, and its objective is to present a field effect transistor by which the drain capacitance per unit gate width can be reduced further.

SUMMARY

A described field effect transistor has a first-conductivity type first semiconductor region with a channel formation region, a gate electrode that is formed in a pattern with a plurality of sides above the channel formation region of the first semiconductor region on a gate insulation film, a second conductivity type drain region that is formed on the surface part of the first semiconductor region within the inner region of the gate electrode, and second-conductivity type source regions that are formed in the surface layer part of the first semiconductor region in respective regions outside the plurality of sides of the gate electrode in widths that do not reduce the corresponding channel widths of the drain region when looked at from the respective outside regions.

In the described field effect transistor, the gate electrode with the plurality of sides is formed in the first-conductivity type first semiconductor region with a channel formation region, a drain region is formed on the inner side of the gate electrode, and source regions are formed in respective regions on the outer side of the plurality of sides in widths that do not reduce the corresponding channel widths of the drain region. That is, the gate electrode is formed along all the sides of the drain region when the transistor is configured.

Advantageously, in the described field effect transistor, the gate electrode is formed repeatedly two-dimensionally in a grid pattern, and drain regions and the source regions are formed alternately and repeatedly two-dimensionally in the inner regions of the aforementioned grids patterns in such a manner that either a drain region or a source region corresponds to a point on the grid. In some instances, the backgates are formed inside the aforementioned first semiconductor region. Furthermore, the backgates and the source regions are connected to each other and a common potential is applied to them.

The described field effect transistor is used as a switch in a breakdown protection circuit for a magnetic head in order to protect the magnetic head from an electrostatic discharge breakdown.

BRIEF DESCRIPTION OF THE DRAWINGS

Example embodiments are described with reference to accompanying drawings, wherein.

DETAILED DESCRIPTION OF EXAMPLE EMBODIMENTS

Example embodiments of field effect transistors according to various aspects of the invention are described below. By forming the gate electrode along all sides of a drain region, the on-resistance can be reduced by a quarter with the same drain capacity, i.e., the drain capacity per unit gate width can be reduced by a quarter.

Figure 1A:
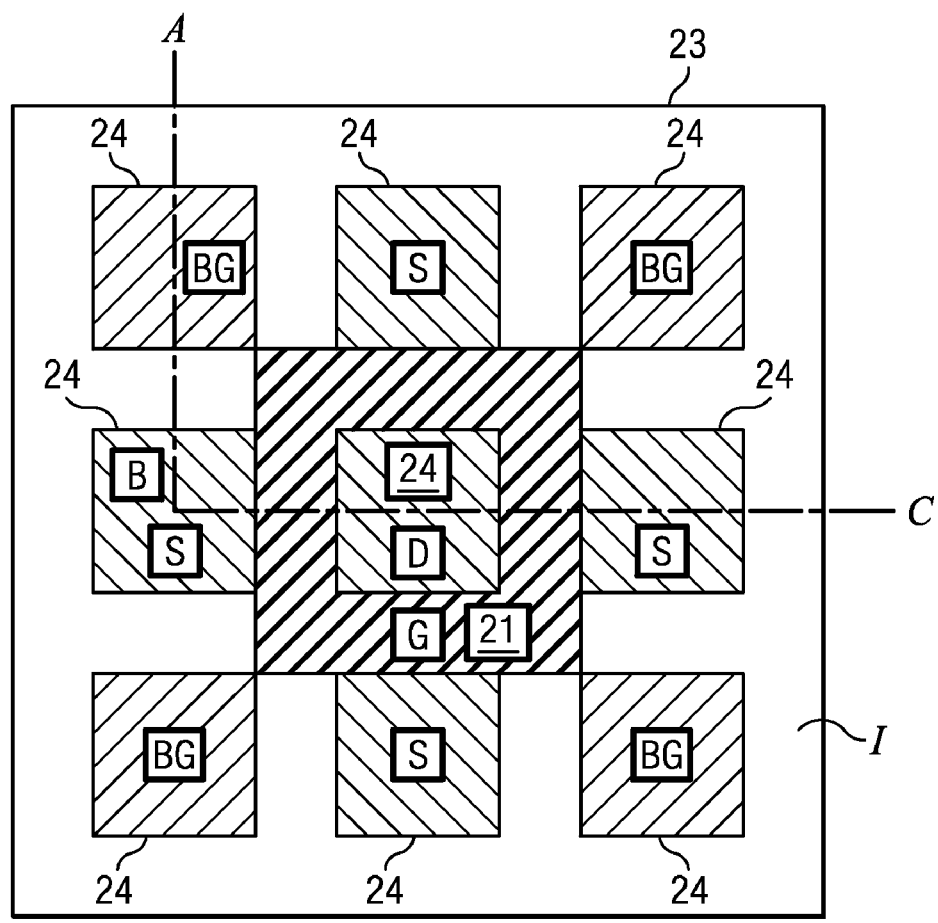
FIG. 1A is a plan view of a field effect transistor according to a first embodiment of the invention.
Figure 1B:
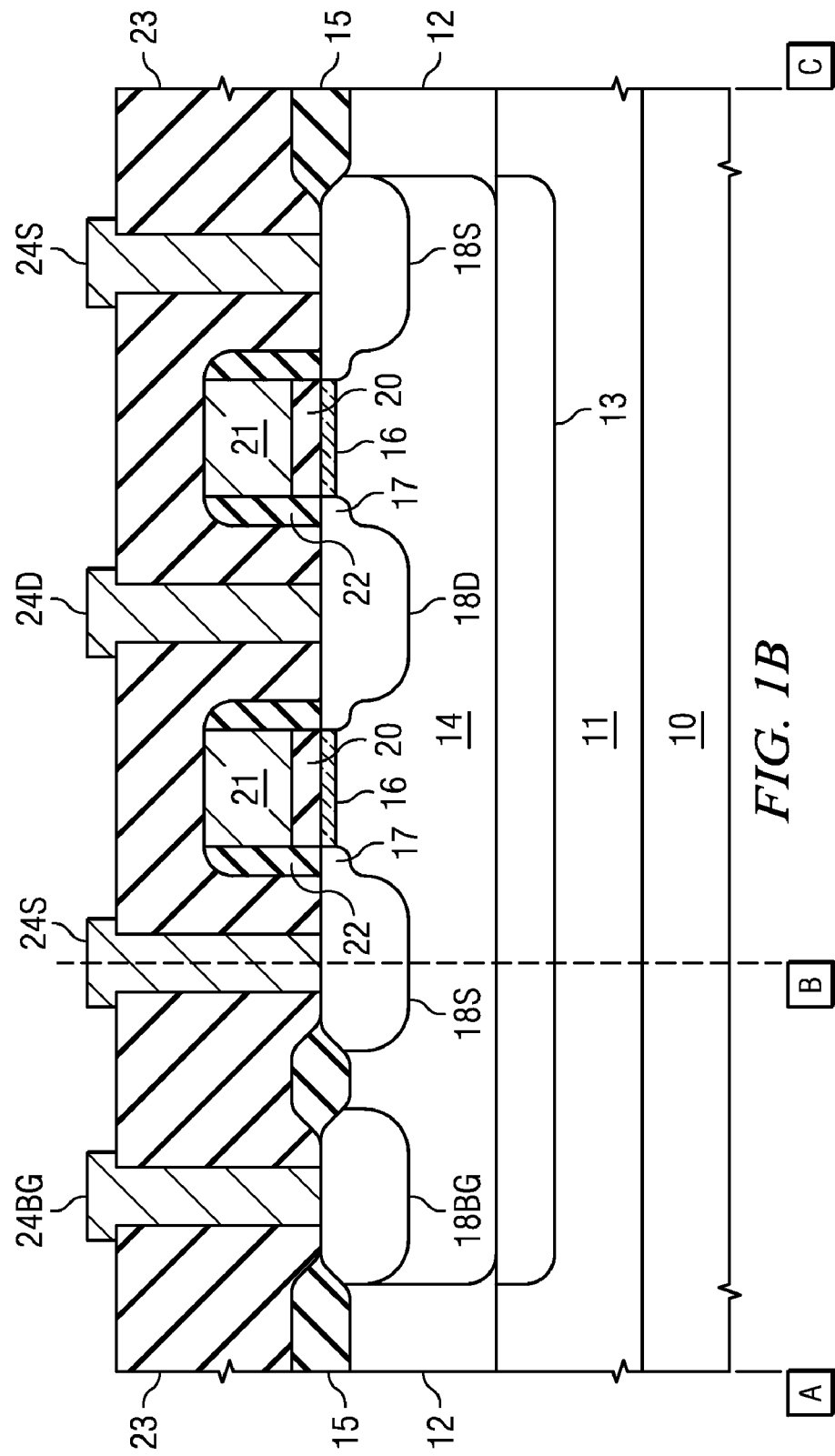
FIG. 1B is a cross-sectional view taken along view line B1-1B in FIG. 1A.

FIG. 1A is a plan view of an example field effect transistor and FIG. 1B is a cross-sectional view taken along view line 1B-1B in FIG. 1A.

As shown in FIG. 1B, a first n-type semiconductor layer (n-type tank) 11 is formed in the p-type silicon substrate (p-sub) 10. A second n-type epitaxial semiconductor layer 12 is then formed on the n-type tank 11. A p-type well (first-conductivity type first semiconductor region) 14 having a channel formation region within an element formation region is formed in the second n-type epitaxial semiconductor layer 12. A $p^+$-type buried layer 13 to be used as a backgate (BG) is formed at the bottom surface of p-type well 14 at a depth close to the boundary between first n-type semiconductor layer 11 and second n-type semiconductor layer 12. In addition, for example, element-separating insulation film 15 (I) is formed in a prescribed pattern on the surface of p-type well 14 to separate elements from each other. Element-separating insulation film 15 (I) may be formed by means of a LOCOS (local oxidation of silicon) method or an STI (shallow trench isolation) method, for example; and an insulation film formed using the LOCOS method is shown in the figure.

A polysilicon gate electrode 21 (G) is formed in a pattern with a plurality of sides above p-type well 14 having a channel formation region beneath a gate insulation film 20. In addition, a sidewall insulation film 22 is formed on either side of gate electrode 21 (G). An $n^-$-type source region 18S (S) and drain region 18D (D) containing a high concentration of an n-type conductive impurity substance (e.g. arsenic and/or phosphorous) are formed in the p-type well 14 at either side part of sidewall insulation film 22. Here, as shown in FIG. 1(A), gate electrode 21 (G) is formed in a square shape, and drain region 18D (D) is formed within the inner region thereof, whereas source regions 18S (S) are formed in respective regions outside and adjacent to the plurality of sides of gate electrode 21 (G) in widths that do not reduce the corresponding channel widths of drain region 18D (D) when looked at from the respective regions on the outer side. Referring to FIG. 1B, furthermore, LDD (lightly doped drain) extension region 17 containing a low concentration of an n-type conductive impurity substance is formed in the p-type well 14 below sidewall insulation film 22 to a depth less than that of the source region 18D and drain region 18D in order to configure a so-called LDD-type source extension region and drain extension region. The n-type channel region 16 containing an n-type conductive impurity substance is formed in the p-type well 14 serving as the channel formation region below gate electrode 21 (G). For example, it is formed as a shallow region where a high concentration of as is introduced reducing both the transistor off current and on-resistance.

The $p^+$-type back gate regions 18BG (BG), which are electrically connected to $p^+$-type back gate buried layer 13 are formed in the p-type well 14 corner portions away from the gate electrode 21 (G). Back gate regions 18BG (BG) may be configured in such a manner that while they are separated from source regions 18S (S) by element-separating insulation film 15 (I), the aforementioned gate electrode 21 (G) is extended as far as the boundary regions between back gate regions 18BG (BG) and source regions 18S (S). In this case, gate electrode 21 (G) takes the shape of a grid.

In addition, for example, interlayer insulation film 23 made of silicon oxide is formed to cover the aforementioned field effect transistor; opening parts that reach source regions 18S (S), drain regions 18D (D), and back gate regions 18BG (BG) are formed; and conductive contacts (24S, 24D, and 24 BG) connected to source regions 18S (S), drain regions 18D (D), and back gate regions 18BG (BG) are formed integrally as one body with plugs buried inside the opening parts.

According to the depletion type n-channel MOS field effect transistor of the present embodiment described above, because a gate electrode 21 is formed along all the sides of the drain region, when compared with a field effect transistor that has the same drain region area with a gate electrode along a single side, the on-resistance can be reduced by a quarter with the same drain capacity, that is, the drain capacity per unit gate width can be reduced by a quarter using the structure of the instant invention.

In the case of the field effect transistor of the present embodiment configured in the aforementioned manner, wires (24S and 24 BG) are connected, back gate regions 18BG (BG) and source regions 18S (S) are connected, and a common potential is applied. In addition, for example, the field effect transistor of the present embodiment is used as a switch in an electrostatic breakdown protection circuit for a magnetic head in order to protect the magnetic head against electrostatic breakdown.

Figure 2:
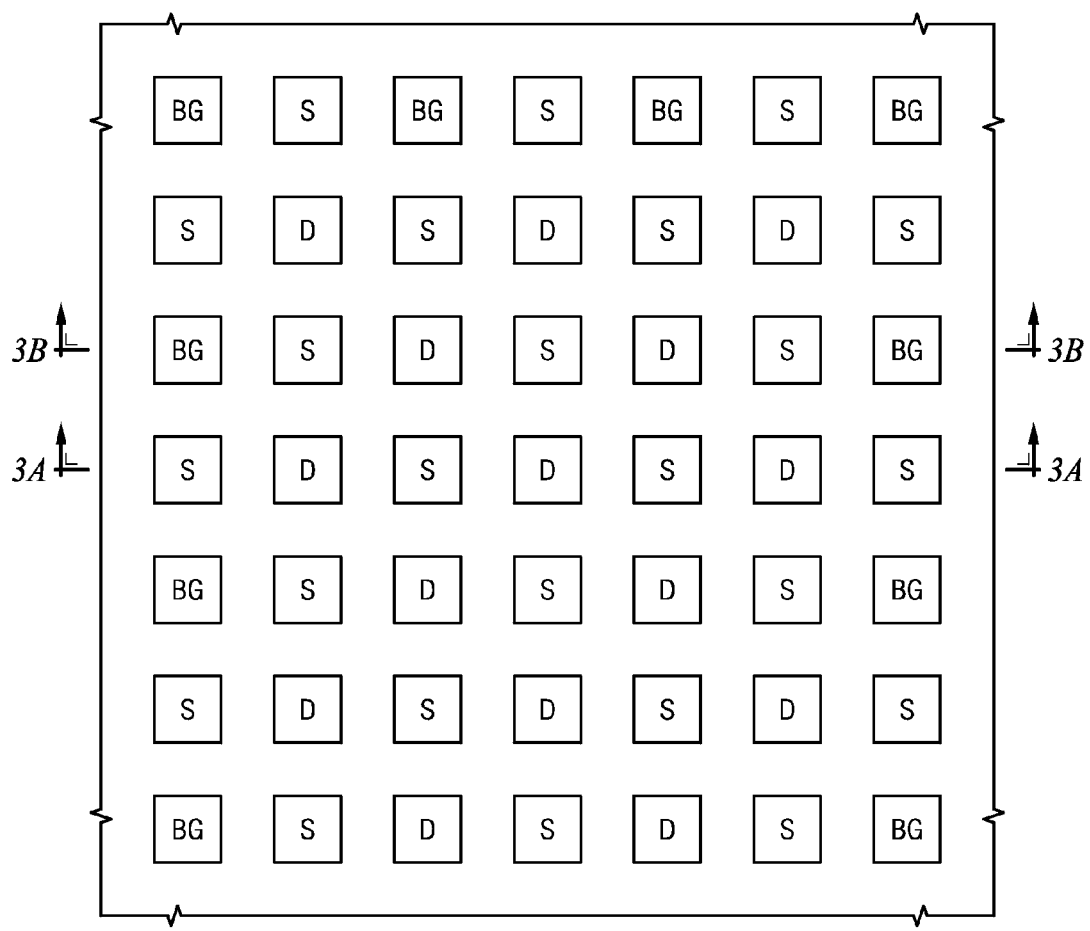
FIG. 2 is a plan view of a field effect transistor according to a second embodiment of the instant invention.

FIG. 2 is a plan view of a field effect transistor according to a further embodiment. Gate electrodes of the kind pertaining to the first embodiment are repeated two-dimensionally in a grid pattern so as to configure gate electrode G where either a drain region or a source region corresponds to a single grid point inside the area of the grid pattern, and drain regions D and source regions S are repeated two-dimensionally. Drain regions D and source regions S are formed in a so-called checkered pattern in the aforementioned manner.

Here, a drain region D is not provided at the outermost circumference. That is, source regions S are formed at the positions corresponding to the sides of a square drain region, and back gate regions BG are laid out between them. As described above, because the sides cannot be used for a drain region at the outermost circumference when configuring the transistor, it is desirable that the outermost region be used for source regions or back gate regions. However, it is also possible to provide drain regions at the outermost circumference.

Although the gate electrode is provided to surround all source regions S and back gate regions BG at the outermost circumferential part in consideration of the ease of removing the gate electrode in the aforementioned configuration, the gate electrode between source regions S and back gate regions BG at the outermost circumferential part may be deleted, and back gate regions BG and source regions S may be separated from each other using element-separation insulation film I.

Figure 3A:
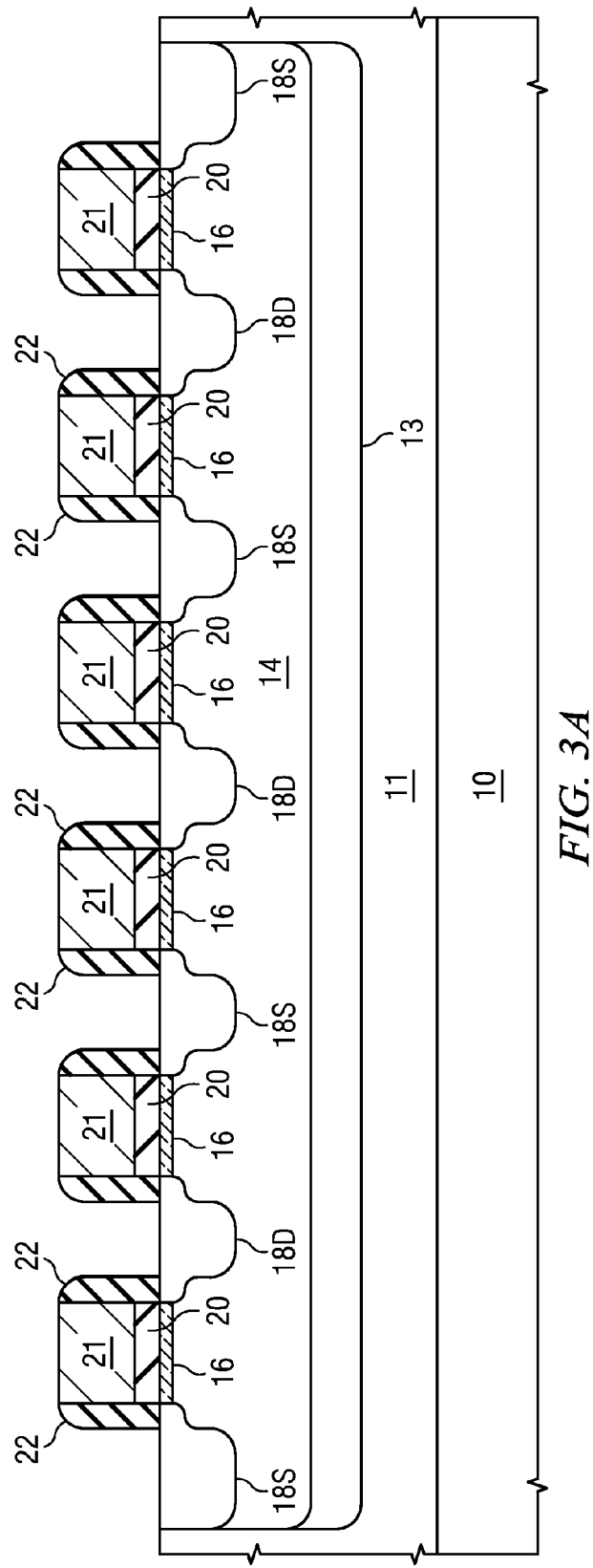
FIG. 3A is a cross-sectional view taken along view line 3A-3A in FIG. 2.

Shown in FIG. 3A is a cross-sectional view taken along view line 3A-3A in FIG. 2. As in the first embodiment, for example, first n-type semiconductor layer 11 is formed in p-type silicon substrate 10. The p$^+$-type buried layer 13 to be used as the back gate, and a p-type well (first-conductivity type first semiconductor region) 14 with a channel formation region is further formed. In addition, gate electrode 21 (G) made of polysilicon is formed in a grid pattern over the aforementioned p-type well 14 and the channel formation region (16) is formed beneath the gate insulation film 20, and sidewall insulation film 22 made of silicon oxide or silicon nitride is formed on either side part of gate electrode 21. Furthermore, n$^+$-type source regions 18S and drain regions 18D are formed alternately and repeatedly in the region inside the grid, and source regions are provided at the outermost circumference. The LDD region 17 is formed in the p-type well 14 below sidewall insulation film 22. The n-type channel region 16 containing an n-type conductive impurity substance such as is formed on the surface part of p-type well 14 serving as the channel formation region below gate electrode 21.

Figure 3B:
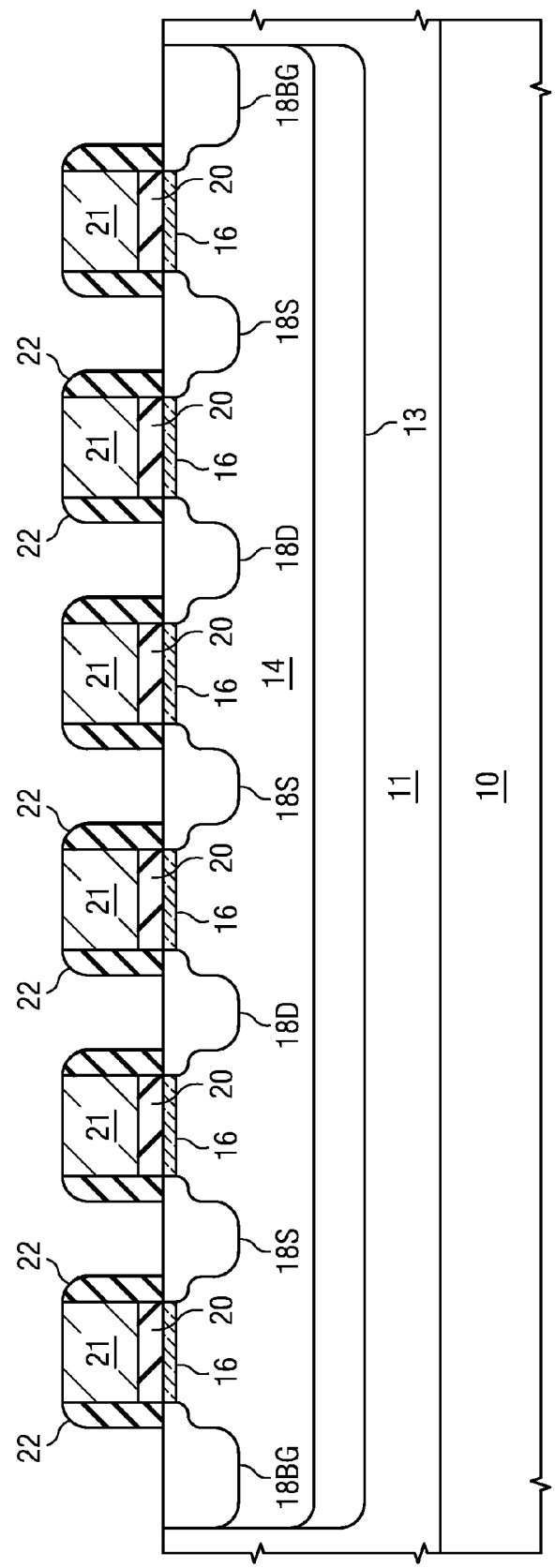
FIG. 3B is a cross-sectional view taken along view line 3B-3B in FIG. 2.

Shown in FIG. 3B is a cross-sectional view taken along view line 3B-3B in FIG. 2. The configuration shown here is similar to that shown in FIG. 3A, except that p$^+$-type back gate regions 18BG are connected electrically to p$^+$-type buried layer 13 to be used as back gates are formed at the outermost circumference, and source regions 18S and drain regions 18D are formed alternately and repeatedly in the region between them.

As shown in the FIG. 2, the gate electrode 21 (G) is formed in the shape of a grid, and extends as far as the boundary between back gate region 18BG (BG) and source region 18S (S) in the aforementioned configuration. Here the back gate region 18BG (BG) and source region 18S (S) may be separated from each other using element-separating insulation film 15 (I). The multiple source regions 18S and drain region 18D are connected into a single system, respectively, using wires to be described later, and back gate regions 18BG are further connected to source regions 18S.

Figure 4:
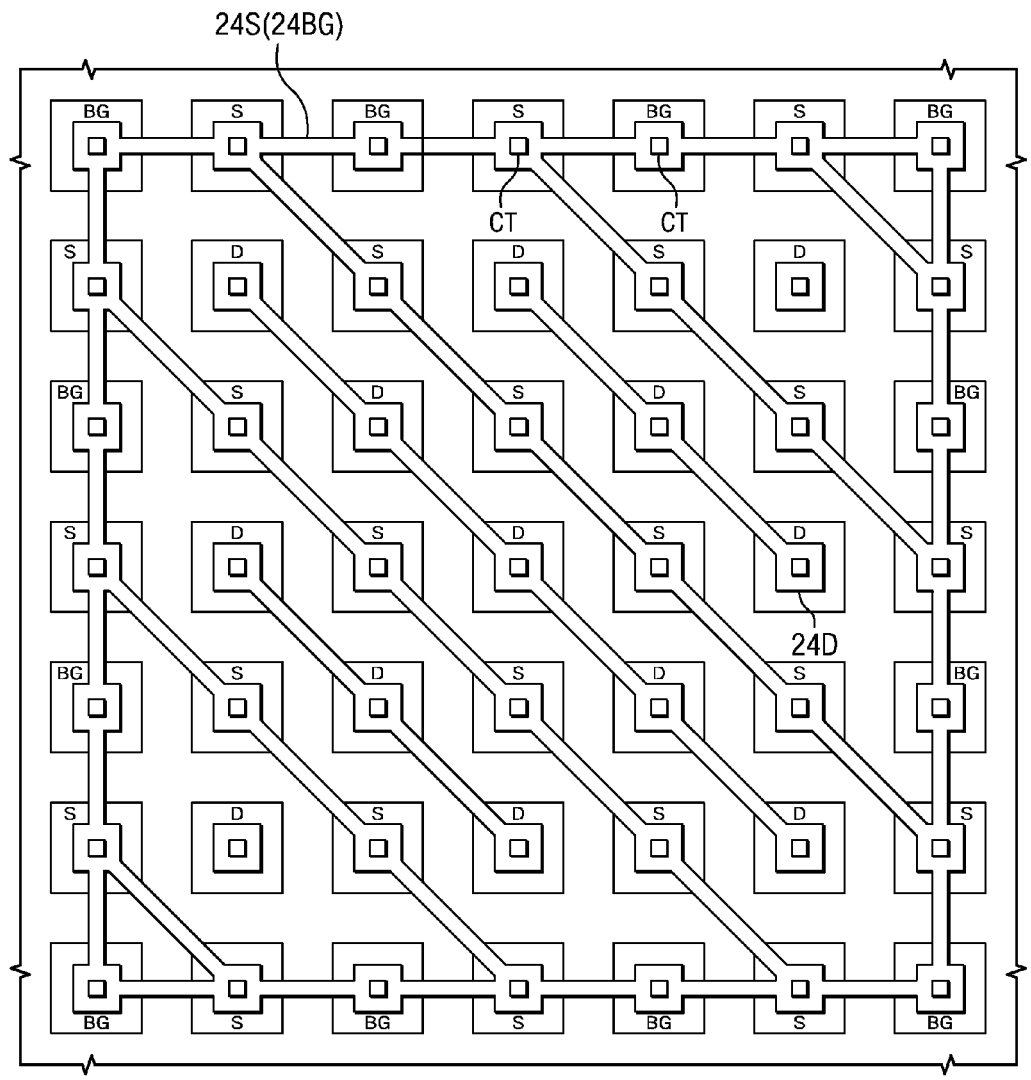
FIG. 4 is a plan view showing the layout of first-layer wirings connected to the source regions, the drain regions, and the backgate regions of the field effect transistor according to the second embodiment of the instant invention.

FIG. 4 is a plan view showing the layout of a first-layer wiring connected to the source regions, the drain regions, and the back gate regions of the field effect transistor pertaining to the present embodiment. Upper-layer wirings (24S, 24D, and 24BG) are formed via contacts CT with respect to source regions S, drain regions D, and back gate regions BG. Source regions S are connected into a single system using wiring 24S; and because wiring 24 BG is connected to wiring 24S, source regions S are connected into a single overall system with back gate regions BG. The drain regions D are divided into sections where they can be connected to each other between wirings 24S, that is, into multiple systems in the figure, and they are connected to wiring 24D.

Figure 5:
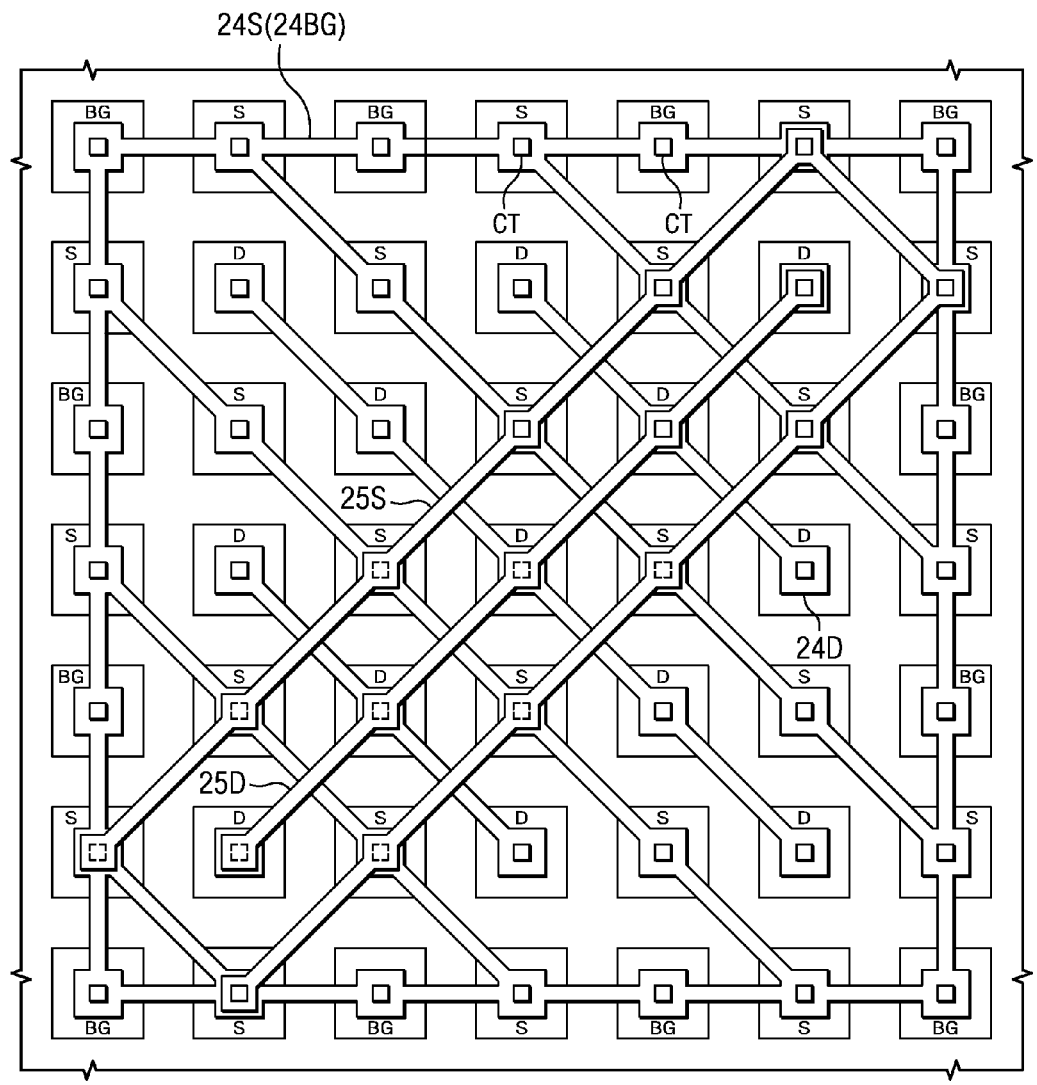
FIG. 5 is a plan view showing the layout of first-layer wirings that connect the source regions and the back gate regions and second-layer wirings that are formed to connect to respective first-layer wirings that connect the drain regions in the field effect transistor according to an alternative implementation of the second embodiment of the instant invention.

FIG. 5 is a plan view showing the layout of first-layer wirings that connect the source regions and the back gate regions, the second-layer wirings are formed to connect to respective first-layer wirings that connect the drain regions in the field effect transistor pertaining to the present embodiment. The first-layer wirings 24D are divided into multiple sections and are all connected together into a single system by second-layer wirings 25D. In addition, while wirings 24S (wirings 24 BG) are already connected into a single system, in this case, the wiring resistance is reduced by second-layer wirings 25S when they are connected into the system. Furthermore, for example, the second wirings (25S and 25D) may be formed in regions other than those shown above in order to reduce the wiring resistance.

In the aforementioned configuration, the source regions and the drain regions are divided into multiple sections in a so-called checkered pattern, and the gate electrode (G) is provided at grid-like boundaries between the respective source regions and the drain regions. As such, while the source regions and the drain region that are adjacent to each other via the gate electrode (G) constitute the field effect transistor, the respective source regions and the drain regions are put together into a single system and a single depletion type n-channel MOS field effect transistor is configured as a whole.

In comparison to a field effect transistor that has the same drain region area but only a single drain region, the aforementioned depletion type n-channel MOS field effect transistor of the present embodiment is equivalent to one in which the gate width of the transistor is significantly widened. As such, the on-resistance can be reduced with the same drain capacitance, that is, the drain capacitance per unit gate width can be reduced.

In the aforementioned field effect transistors of the first embodiment and the second embodiment, the back gate regions are separated from the source regions by an element-separating insulation film, or the gate electrode extends as far as the boundaries between the back gate regions and the source regions, and the source regions and the back gate regions are connected using upper-layer wirings. However, when connection of the source regions to the back gate regions is assumed, there is no need to divide the source regions and the back gate regions into separate regions using the element-separating insulation film. In the case of the field effect transistor of the present embodiment, the source regions and the back gate regions are provided next to each other without separating them using an element-separating insulation film.

Figure 6A:
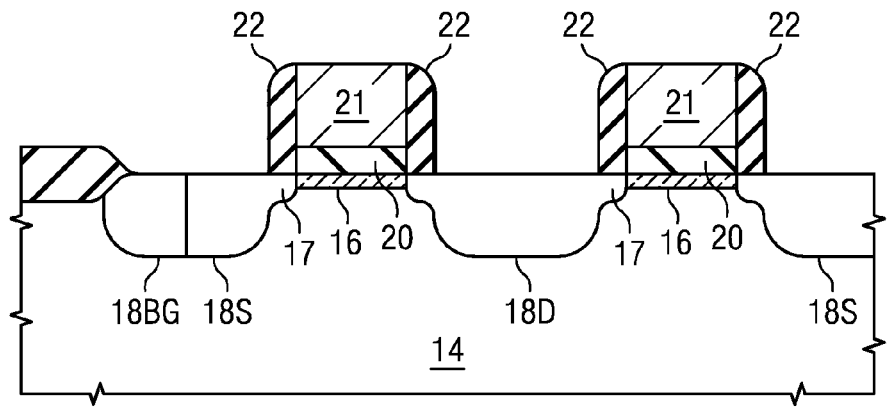
FIG. 6A is a partial cross-sectional view of a field effect transistor according to a third embodiment of the instant invention.

Shown in FIG. 6A is a partial cross-sectional view of a field effect transistor according to a further embodiment of the instant invention. As shown in FIG. 3A, gate electrodes 21 are formed in a grid pattern, n$^+$-type source regions 18S and drain regions 18D are formed in the inner regions of the respective grids alternately and repeatedly, and source regions 18S are provided at the outermost circumference.

As shown in FIG. 6(A), p$^+$-type back gate regions 18BG are provided adjacent to source regions 18S provided at the outmost circumference without separating them using an element-separating insulation film. In this case, contacts common to respective source regions 18S and back gate regions 18BG can be used to connect them to an upper-layer wiring. Source regions 18S and back gate regions 18BG provided adjacent to each other without an element-separating insulation film as in the aforementioned manner can be formed by providing a mask opening part for implanting an n-type impurity to form source regions 18S and a mask opening part for injecting a p-type impurity substance so as to form back gate regions 18BG adjacent to each other, that is, by injecting impurity substances into adjoining regions.

Figure 6B:
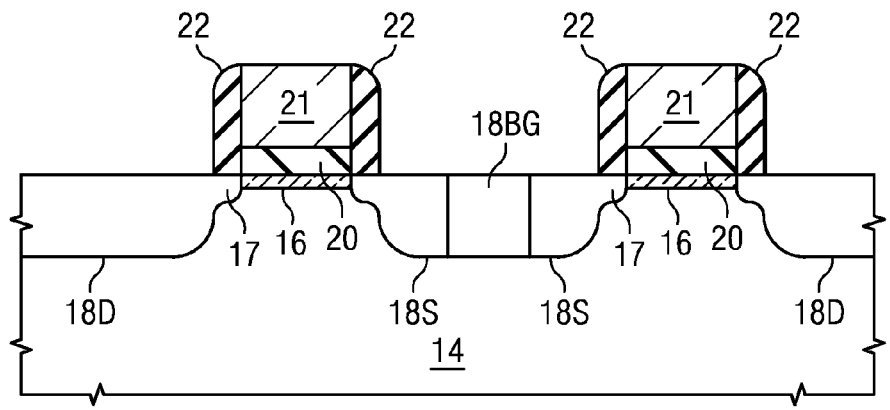
FIG. 6B is a partial cross-sectional view of another example according to a third embodiment of the instant invention.

Shown in FIG. 6B is a partial cross-sectional view of another example of a field effect transistor according to a further embodiment of the instant invention. As shown in the FIG. 6B, in a configuration in which n$^+$-type source regions 18S and drain regions 18D are repeated alternately, p$^+$-type back gate regions 18BG are provided adjacent to regions further inside source regions 18S without separation using an element-separating insulation film with respect to source regions 18S in regions sandwiched by drain regions 18D. Similarly, source regions 18S and back gate regions 18BG may be connected using common contacts common to them, and such structure can be formed by implanting respective impurity substances into adjoining regions. The configuration of the present embodiment can be applied to the aforementioned respective embodiments. Furthermore, because the back gate regions for establishing connections to the back gates can be laid out adjacent to the source regions, the element area of the structure is reduced.

Figure 7:
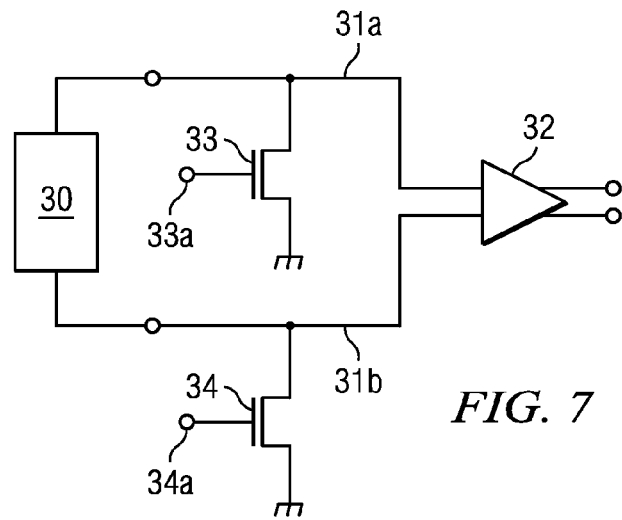
FIG. 7 is a schematic circuit diagram of a circuit for protecting a magnetic head, such as a GMR magnetic head, against electrostatic breakdown (ESD) incorporated into a magnetic recording device.
Figure 8A:
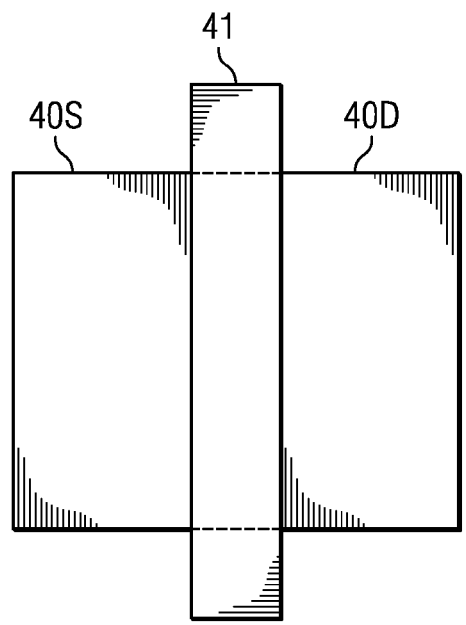
FIGS. 8A and 8B are plan views of depletion type n-channel MOS field effect transistors according to the prior art.
Figure 8B:
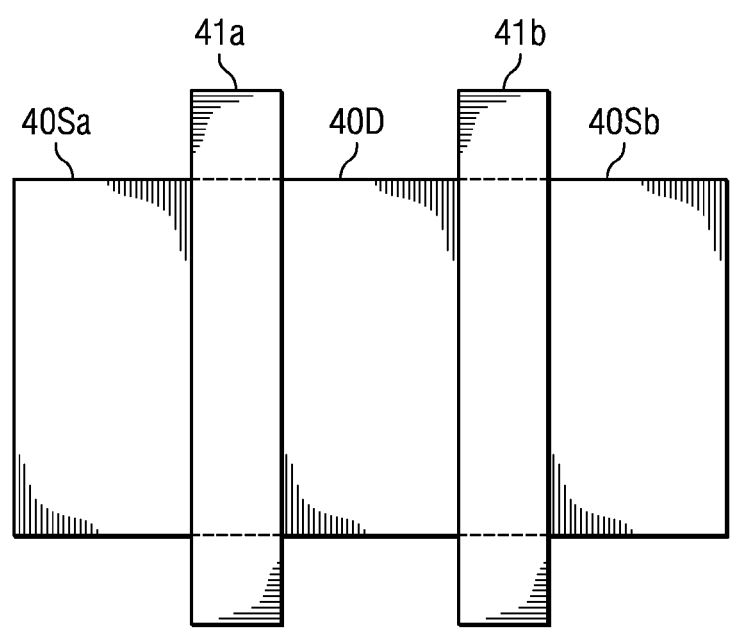

FIG. 7 is a circuit diagram of a circuit for protecting a magnetic head against electrostatic breakdown (ESD) and is used for a magnetic head, such as a GMR magnetic head, incorporated into a magnetic recording device. The field effect transistors in the aforementioned respective embodiments can be used as a switch element of the protective circuit. For example, magnetic head 30, such as a GMR magnetic head, is connected to preamplifier 32 via line 31a and line 31b. Here, field effect transistors 33 and 34 are connected to line 31a and line 31b, respectively, to serve as ESD protection circuits. The ESD protection circuits are configured using the aforementioned depletion type n-channel field effect transistors with the aforementioned respective embodiments, their drain regions are connected to lines 31a and 31b, and their source regions are connected to a reference potential (for example, ground).

Because the ESD protection circuits become conductive when an excessive voltage is applied to lines 31a and 31b so as to release the excessive voltage to the reference potential, a negative potential is applied to gate terminals 33a and 34a of the depletion type field effect transistors 33 and 34 to keep transistors 33 and 34 non-conductive while under the steady state. A bias current is supplied to magnetic head 30 through a path comprising a positive-side power supply, line 31a, magnetic head 30, line 31b, and a negative-side power supply. At this time, the voltage of the positive-side power supply is +3V to +5V, and the voltage of the negative-side power supply is −2V to −5V. In this case, gate electrodes 33a and 34a of field effect transistors 33 and 34 may be connected to the negative-side power supply. In addition, a voltage difference of roughly 100 mV is created between line 31a and line 31b, that is, across the two ends of magnetic head 30.

While preamplifier 32 and field effect transistors 33 and 34 can be formed on a single semiconductor integrated circuit (IC), magnetic head 30 is attached to such semiconductor integrated circuit externally.

The invention is not restricted to the explanation given above. For example, a silicide layer may be formed partially or entirely over the surfaces of the source regions, the drain regions, the back gate regions, and the gate electrode. For example, it can be formed over the entire surfaces of the source regions, the drain regions, the back gate regions, and the gate electrode by means of siliciding process. Although depletion type field effect transistors were explained in the aforementioned embodiments, application to an enhancement type by not forming a channel region is also possible. In addition, although an n-channel depletion mode field effect transistor was explained, application to a p-channel depletion mode field effect transistor is also possible by simply reversing the n-type and p-type regions of the structures shown in the figures.

What is claimed is:
1. A field effect transistor, comprising:
   a well region of first conductivity type formed in an isolated region of a semiconductor substrate;
   a gate structure formed over the well region and including a gate dielectric and a gate electrode formed over the gate dielectric; the gate electrode being formed in a square pattern having a central opening;
   a drain region of second conductivity type formed in the well region adjacent the gate electrode, within the central opening of the square pattern of the gate electrode;
   source regions of the second conductivity type formed in the well region adjacent the gate electrode at centers of sides of the square pattern of the gate electrode;
   back gate contact regions of the first conductivity type formed in the well region adjacent the gate electrode at corners of the square pattern of the gate electrode;
   one or more transistor channel regions being defined in the well region below the gate electrode, between the source regions and the drain region, and
   further including additional drain regions of the second conductivity type formed in the well region adjacent the gate electrode, within additional openings along diagonals of the square pattern of the gate electrode.

2. The field effect transistor of claim 1, further comprising additional source regions of the second conductivity type formed in the well region adjacent the gate electrode, within additional openings, in a configuration wherein each of the drain region and additional drain regions is at a center of a square defined by four source regions.

3. The field effect transistor of claim 1, further comprising additional source regions of the second conductivity type formed in the well region adjacent the gate electrode, within additional openings, in a configuration wherein each of the drain region and additional drain regions is at a center of a square defined by four source regions.

4. The field effect transistor of claim 1, further comprising additional back gate contact regions of the first conductivity type formed in the well region adjacent the electrode along sides of the square pattern, between the source regions at the centers of the sides and the back gate contact regions at the corners.

5. The field effect transistor of claim 1, further comprising a first layer of wiring connecting ones of the source regions and additional source regions together.

6. The field effect transistor of claim 5, wherein the first layer of wiring also connects ones of the source regions to one or more of the back gate contact.

7. The field effect transistor of claim 5, further comprising a second layer of wiring connecting one or more of the connections of the first layer of wiring.

8. The field effect transistor of claim 1, wherein the gate structure has additional openings; and the source regions are formed adjacent the gate electrode, within ones of the additional openings.

9. The field effect transistor of claim 8, further comprising additional drain regions of the second conductivity type formed in the well region adjacent the gate electrode, within others of the additional openings along diagonals of the square pattern.

10. The field effect transistor of claim 9, further comprising additional source regions of the second conductivity type formed in the well region adjacent the gate electrode, the additional openings, in a configuration wherein each of the drain region and additional drain regions is at a center of a square defined by four source regions.

11. The field effect transistor of claim 10, further comprising additional back gate contact regions of the first conductivity type formed in the well region adjacent the gate electrode along sides of the square pattern, between the source regions at the centers of the sides and the back gate contact regions at the corners.

12. The field effect transistor of claim 11, further comprising a first layer of wiring connecting ones of the source regions and additional source regions together.

13. The field effect transistor of claim 12, wherein the first layer of wiring also connects ones of the drain region and the additional drain regions together.

14. The field effect transistor of claim 13, wherein the first layer of wiring also connects ones of the source regions and additional source regions to one or more of the back gate contact regions and additional back gate contact regions.

15. The field effect transistor of claim 14, further comprising a second layer of wiring connecting ones of the connections of the first layer of wiring.

* * * * *